*(12)* United States Patent
Chen et al.

US011404810B2

(10) Patent No.: US 11,404,810 B2
(45) Date of Patent: Aug. 2, 2022

(54) DUAL-BACKPLANE STRUCTURE AND ELECTRONIC DEVICE USING SAME

(71) Applicant: Celestica Technology Consultancy (Shanghai) Co. Ltd, Shanghai (CN)

(72) Inventors: Yaxu Chen, Shanghai (CN); Yuan Xue, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 17/239,665

(22) Filed: Apr. 25, 2021

(65) Prior Publication Data

US 2021/0344131 A1 Nov. 4, 2021

(30) Foreign Application Priority Data

Apr. 29, 2020 (CN) .......................... 202010356484.9
Apr. 29, 2020 (CN) .......................... 202020694397.X

(51) Int. Cl.
  *H05K 1/14* (2006.01)
  *H01R 12/72* (2011.01)
  *G06F 1/18* (2006.01)

(52) U.S. Cl.
  CPC .......... *H01R 12/722* (2013.01); *G06F 1/181* (2013.01); *G06F 1/183* (2013.01); *H05K 2201/044* (2013.01)

(58) Field of Classification Search
  USPC ....................................................... 361/736
  See application file for complete search history.

(56) References Cited

U.S. PATENT DOCUMENTS

| | | | | |
|---|---|---|---|---|
| 5,980,312 A | * | 11/1999 | Chapman | G02B 6/4452 361/788 |
| 7,281,063 B2 | * | 10/2007 | Benson | G06F 13/409 710/2 |
| 7,894,195 B2 | * | 2/2011 | Lin | G06F 1/184 361/727 |
| 2015/0181768 A1 | * | 6/2015 | Chen | H05K 7/20727 361/679.46 |

* cited by examiner

*Primary Examiner* — Hung S. Bui

(57) ABSTRACT

The present disclosure provides a dual-backplane structure and electronic device using the same. The dual-backplane structure includes: a first backplane having an opening, and the front side of the first backplane includes at least one connector connected with a connector of the second assembly surface on a main board of a control module; a second backplane disposed on the back of the first backplane, the front side of the second backplane includes a connector connected with a connector of the first assembly surface on a main board of a control module; the back side of the second backplane includes a plurality of hard disk connectors for connecting with the hard disk module. At least one connector on the front side of the second backplane is connected with the connector corresponding to the first assembly surface on the main board through the opening of the first backplane.

10 Claims, 8 Drawing Sheets

DUAL-BACKPLANE STRUCTURE AND ELECTRONIC DEVICE USING SAME

CROSS REFERENCES TO RELATED APPLICATIONS

This application claims the benefits of priority to Chinese Patent Application No. CN 2020103564849, filed with CNIPO on Apr. 29, 2020, and Chinese Patent Application No. CN 202020694397X, filed with CNIPO on Apr. 29, 2020, the contents of which are incorporated herein by reference in their entirety.

TECHNICAL FIELD

The present disclosure relates to the field of server or storage technology, and in particular, to the field of backplane technology.

BACKGROUND

For servers or storage devices with dual control modules, there is a common layout pattern: two control modules are placed side by side in the chassis. As shown in FIG. 1, a top view of a server system including two side-by-side control modules (control module 21, control module 22) is illustrated. In general, servers or storages with two side-by-side control modules will have different modules in the system bridged through a backplane. These modules include: control modules, a hard disk, a power supply module, etc. Each module is connected with the backplane through different connectors. Therefore, many signals will pass through the backplane. For example: the signal line from the control module to the hard disk, the interconnection signal line between the two control modules, and the power line for the power module to supply power to each module.

For the design of general server or storage chassis, the size is required to meet a certain server rack standard, and there are usually two standards of 19-inch rack and 21-inch rack. Therefore, the width of the server or storage chassis is limited. When there are less signals passing through the backplane, the single backplane is feasible for a side-by-side dual control module system. However, when there are too many signal lines passing through the backplane, more or larger connectors are needed, and a single backplane cannot meet the interconnection requirements of the system. The single backplane structure may have the following three problems for the side-by-side dual control module system.

1) Within the limited width, the number of connectors that can be placed on the main board and backplane of the control modules is limited, which may not meet actual needs. As shown in FIG. 2, if a large connector needs to be placed in the areas represented by two squares, the connector will interfere with the hard disk connector 11 on the back of the backplane. Therefore, it is necessary to avoid interference by decreasing the number of hard drives. However, decreasing the number of hard drives will reduce the overall cost performance of the server or storage.

2) When there are too many signal lines passing through the backplane, it is very difficult to fan out the signal traces near the connectors on the backplane.

As shown in FIG. 3, when there are a large number of signal connectors, the signal line fan-out space 13 between the connector 12 on the front side of the backplane 1 and the hard disk connector 11 on the back side of the backplane is greatly reduced. Therefore, the number of signal lines that can be fanned out by a single circuit board layer is also reduced. Therefore, it is often necessary to increase the number of circuit board layers to increase the signal fan-out area. As a result, costs relating to circuit boards will increase, which will reduce the competitiveness of the product.

3) Other methods, such as adopting cables, may solve the above two problems, but the entire chassis will need to be lengthened accordingly.

As shown in FIG. 4, assuming that the control module 21 and the control module 22 are connected through a cable 23, the above problems can be solved. However, the cable 23 and its assembly require a certain amount of space. This extra space needs to be obtained by lengthening the chassis. However, in order to match the standard server racks, the length of the server or storage chassis is restricted. In other words, the space for the cable 23 and its assembly is limited. When the space required by the cable 23 and its assembly exceeds the limit, the solution using cables will not be feasible.

SUMMARY

The present disclosure provides a dual-backplane structure and an electronic device using the same, for solving the problem that the single backplane cannot meet the dual control module case which requires more signals on the backplane.

The present disclosure provides a dual-backplane structure, which includes: a first backplane having an opening, wherein a front side of the first backplane includes at least one connector connected with a connector of the second assembly surface on the main board of a control module; and a second backplane disposed on a back side of the first backplane, wherein a front side of the second backplane includes at least one connector, which is connected with a connector of the first assembly surface on the main board of the control module through the opening of the first backplane, wherein a back side of the second backplane includes a plurality of hard disk connectors for connecting with a hard disk module, at least one connector on the front side of the second backplane is connected with the connector corresponding to the first assembly surface on the main board through the opening of the first backplane.

In an embodiment of the present disclosure, the upper edge of the opening of the first backplane has a shape matching with the upper surface of the connector on the main board of the control module passing through the opening.

In an embodiment of the present disclosure, the control module includes a first control module and a second control module, the connector of the first backplane includes a first connector and a second connector, which are respectively connected with a connector in the first control module for connecting with the second control module and a connector in the second control module for connecting with the first control module.

In an embodiment of the present disclosure, the first connector and the second connector in the first backplane are respectively disposed at two ends of the first backplane, the length of the opening matches the length of either a connector in the first control module that is connected with the at least one connector of the second backplane, or a connector in the second control module that is connected with the at least one connector of the second backplane.

In an embodiment of the present disclosure, the first backplane and the second backplane respectively includes a plurality of ventilation holes.

In an embodiment of the present disclosure, in an overlapping area of the first backplane and the second backplane, the ventilation holes in the first backplane overlap the ventilation holes in the second backplane.

In an embodiment of the present disclosure, the first backplane and the second backplane are fixed by a plurality of screws or bolts.

The present disclosure also provides an electronic device, including: a first control module and a second control module placed side by side; a dual-backplane structure connected with the first control module and the second control module described above; and a hard disk module connected with a second backplane in the dual-backplane structure.

In an embodiment of the present disclosure, the connector in the first control module for connecting with the second control module is retracted inward by a preset distance relative to the main board of the first control module; the connector in the second control module for connecting with the first control module is retracted inward by a preset distance relative to the main board of the second control module; an outer surface of the inwardly retracted connector in the first control module together with an outer surface of the inwardly retracted connector in the second control module forms the second assembly surface; an outer surface of the connector which is not inwardly retracted in the first control module together with an outer surface of the connector which is not inwardly retracted in the second control module forms the first assembly surface.

In an embodiment of the present disclosure, a length of the second backplane in the dual-backplane structure matches a total width of the first control module and the second control module; a length of the first backplane in the dual-backplane structure matches a sum of a length of the inwardly retracted connector in the first control module, a length of the inwardly retracted connector in the second control module, and a distance between the two inwardly retracted connectors.

As mentioned above, a dual-backplane structure and electronic device using the same in the present disclosure has the following beneficial effects:

1. In the dual-backplane structure of the present disclosure, the task of interconnecting signal lines is split between different backplanes so that the number of signal lines that a single backplane needs to carry is reduced. The number of PCB layers of backplanes needed is effectively reduced, thereby reducing the cost relating to circuit boards, reducing the fan-out density of signal lines near the connectors on the backplane, and simplifying signal routing on the circuit board.

2. In the dual-backplane structure of the present disclosure, the main board and its connectors are only slightly retracted, the length of the chassis will not be increased, and therefore the structure can well match the standard server racks and has wider applicability.

Figure 1:
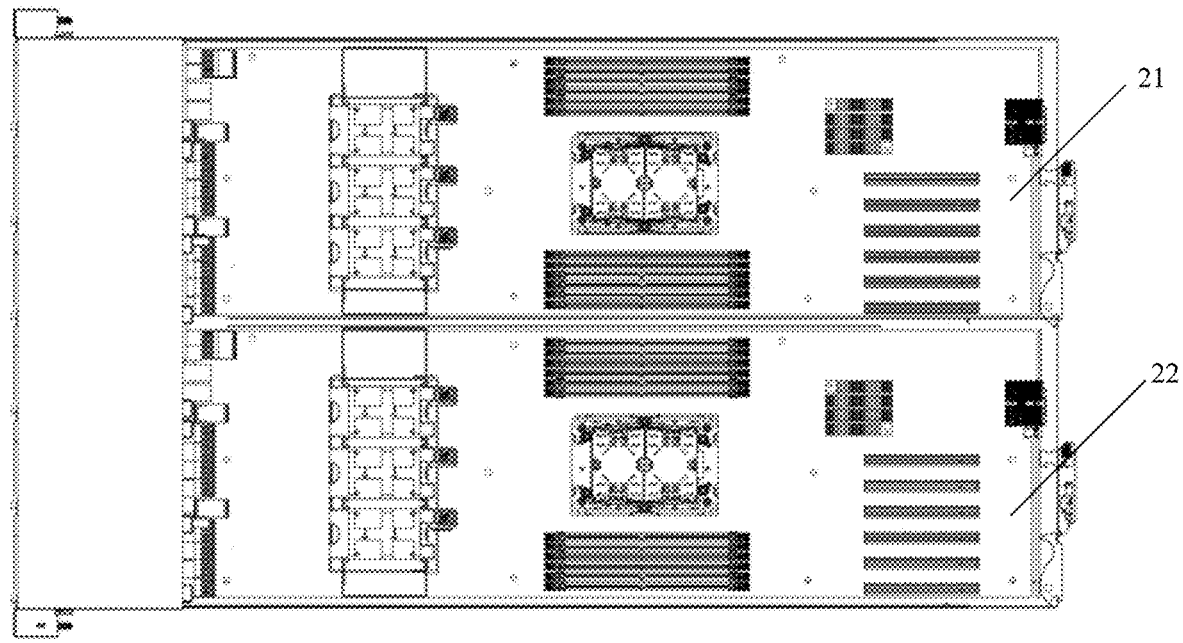
FIGS. 1 to 4 are schematic diagrams showing the connection modes of backplanes in dual control modules in the prior art.
Figure 2:
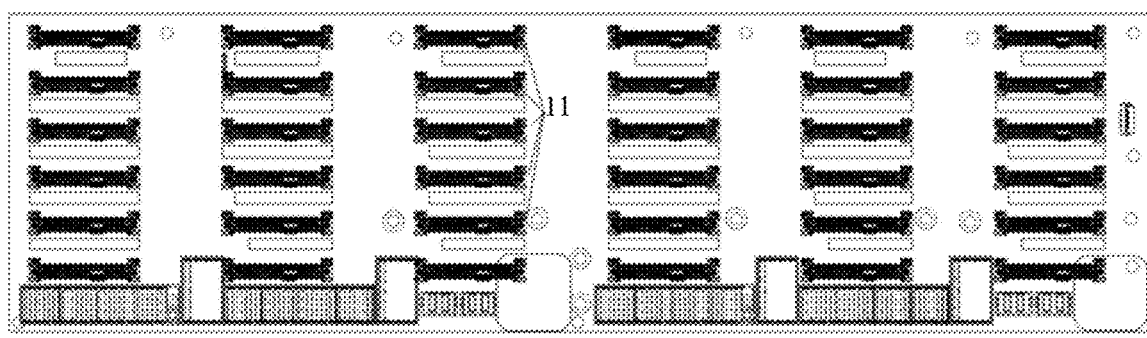
Figure 3:
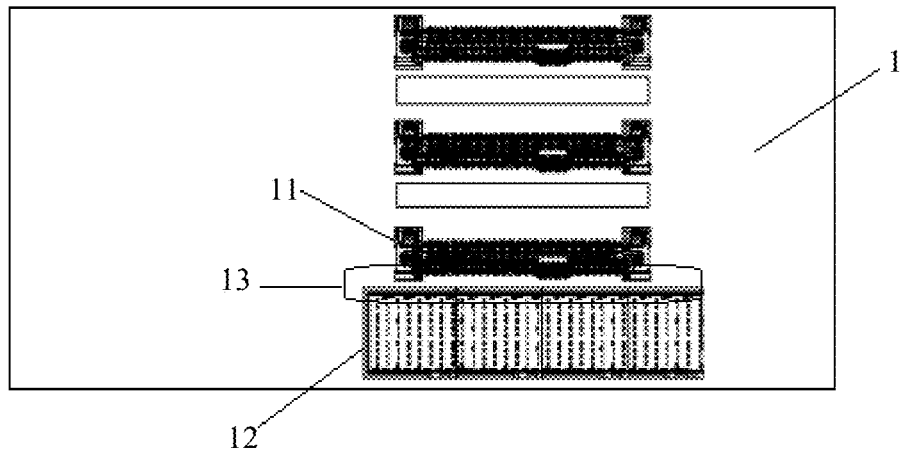
Figure 4:
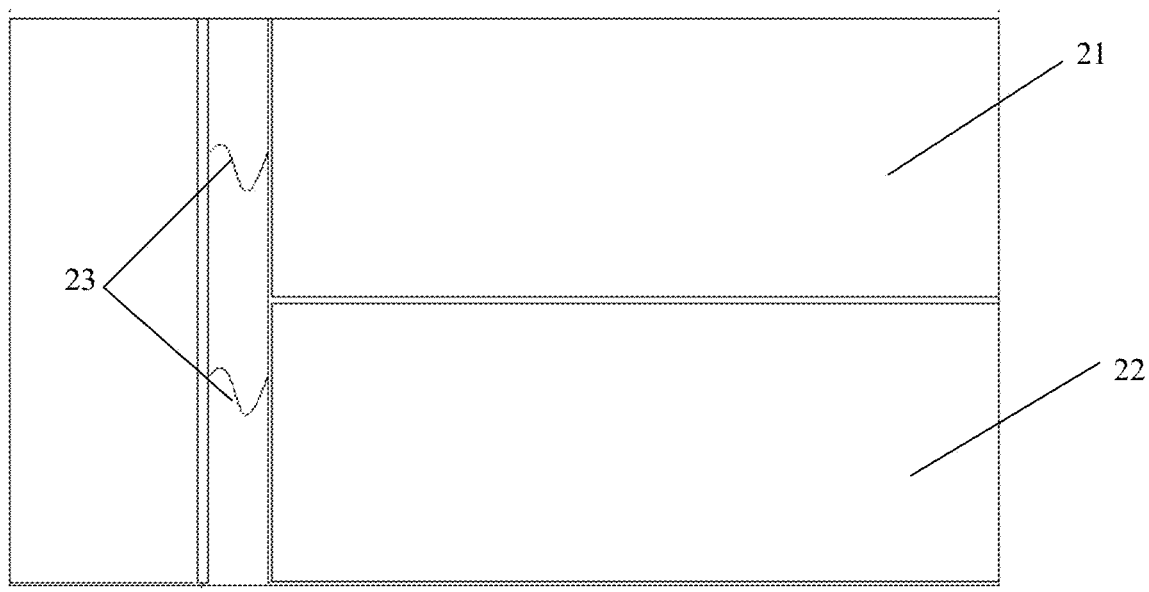

LIST OF REFERENCE NUMERALS 21, 22 control module
11 Hard disk connector
12 Connector
13 Signal line fan out space
23 Cable
100 Dual-backplane structure
110 First backplane
111 Opening
112 First connector
113 Second connector
114 Ventilation hole
115 Connection hole
120 Second backplane
121 Connector
122 Hard disk connector
123 Ventilation hole
124 Connection hole
125 Connector
210 First control module
211 Connector
212 Connector
213 First assembly surface
214 Second assembly surface
220 Second control module
221 Connector
222 Connector
300 Hard Disk Module

DETAILED DESCRIPTION

The following describes the implementation of the present disclosure through exemplary embodiments, and those skilled in the art can easily understand other advantages and effects of the present disclosure from the content disclosed in this specification. The present disclosure can also be implemented or applied through other different specific embodiments, and various details in this specification can also be modified or changed based on different viewpoints and applications without departing from the spirit of the present disclosure.

Please refer to FIGS. 5 to 12. It should be noted that the structures, proportions, sizes, etc. shown in the accompanying drawings in this specification are only used to help persons skilled in the art understand the content disclosed in the specification, and are not intended to limit the implementation of the present disclosure, therefore having no technical substantive meaning. Any structural modification, proportional relationship change or size adjustment without affecting the effects and objectives of the present disclosure should still fall into the scope of the present disclosure. At the same time, the terms such as "upper", "lower", "left", "right", "middle" and "one" cited in this specification are only for convenience of description and are not used to limit the scope. The scope of implementation of the disclosure, the change or adjustment of the relative relationship without substantial changes to the technical content, shall be regarded as the scope of implementation of the disclosure.

The present disclosure provides a dual-backplane structure and an electronic device using the same, to solve the problems with a side-by-side dual control module system: a dual-CPU arrangement affects the length of the chassis, the number of CPUs cannot be flexibly configured with arrangement, and the heat dissipation performance is not good.

The following will describe the principle and implementation of a dual-backplane structure and an electronic device using the same, so that those skilled in the art can understand the present application without creative work.

Embodiment 1

Figure 5:
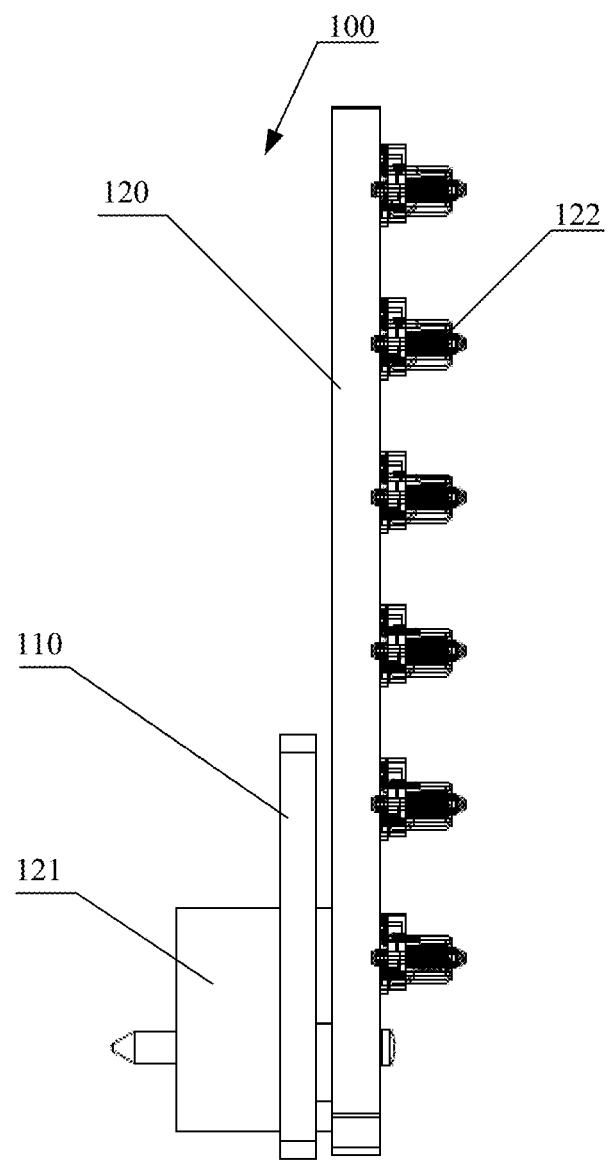
FIG. 5 is a side view of a dual-backplane structure of the present disclosure.

As shown in FIG. 5, this embodiment provides a dual-backplane structure 100, and the dual-backplane structure 100 includes a first backplane 110 and a second backplane 120.

Figure 6:
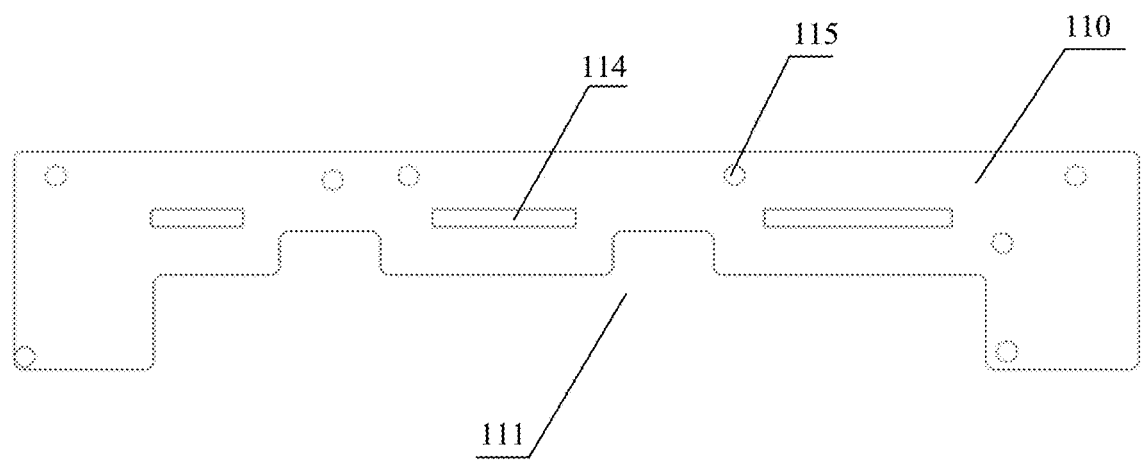
FIG. 6 is a schematic diagram of the structure of the back side of a first backplane in a dual-backplane structure of the present disclosure.
Figure 7:
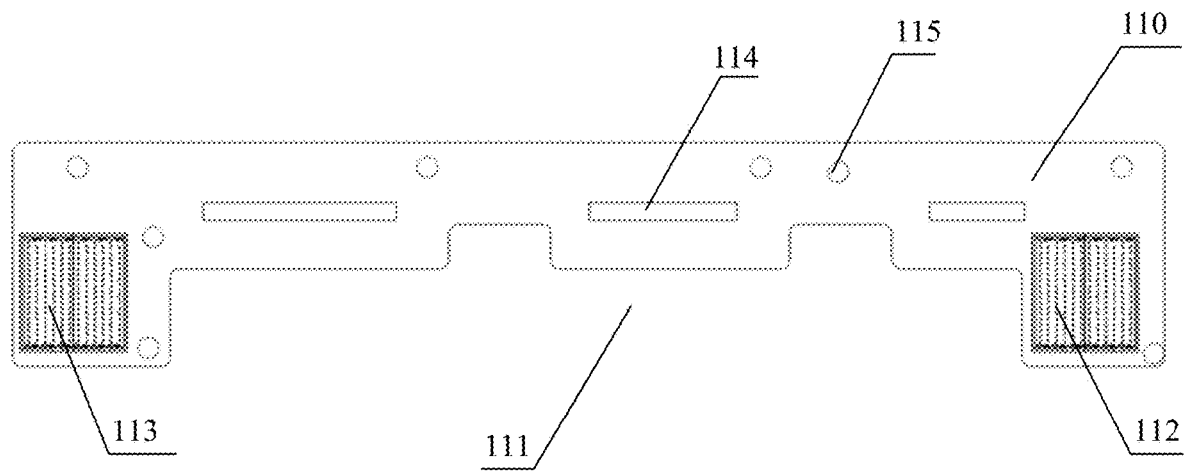
FIG. 7 is a schematic diagram of the structure of the front side of a first backplane in a dual-backplane structure of the present disclosure.
Figure 11:
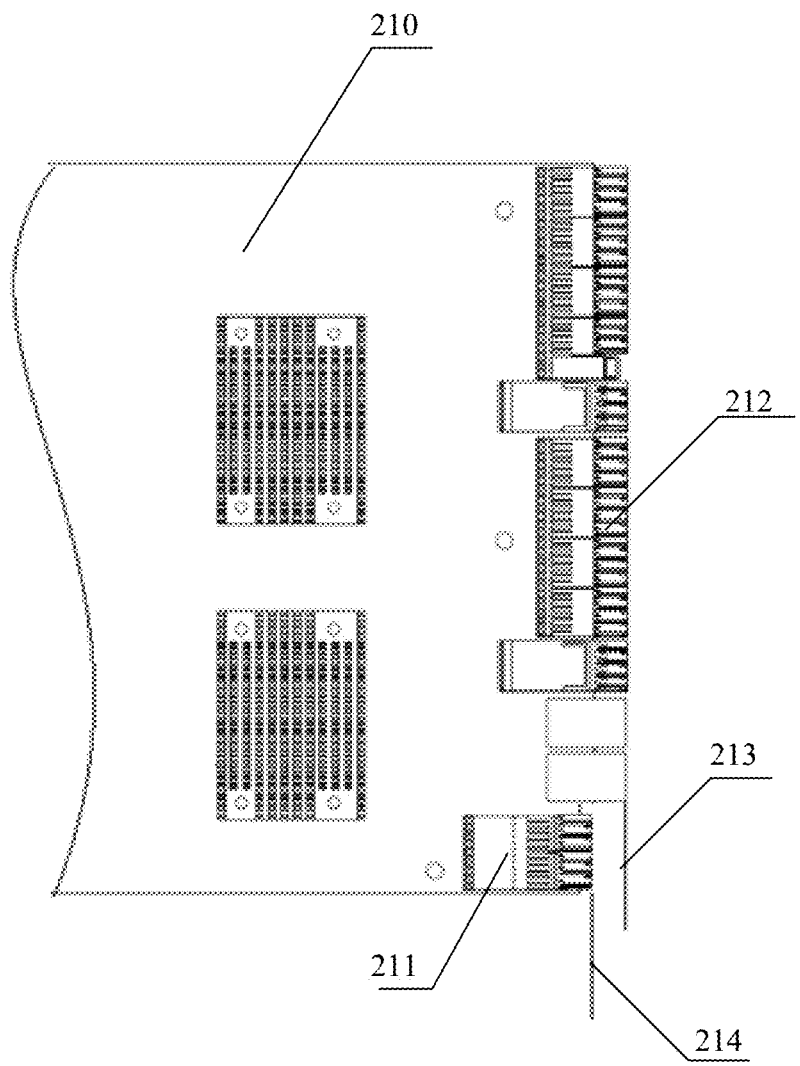
FIG. 11 is a schematic diagram showing a staggered arrangement of connectors of a first control module in an electronic device of the present disclosure.

Specifically, in this embodiment, as shown in FIG. 6 and FIG. 7, the first backplane 110 has an opening 111, and (as shown in FIG. 11) a front side of the first backplane 110 include at least one connector (e.g., connector 112 and connector 113) connected with a corresponding connector (e.g., connector 211 or connector 221 shown in FIG. 12) of the second assembly surfaces 214 on the main board of a control module.

Figure 8:
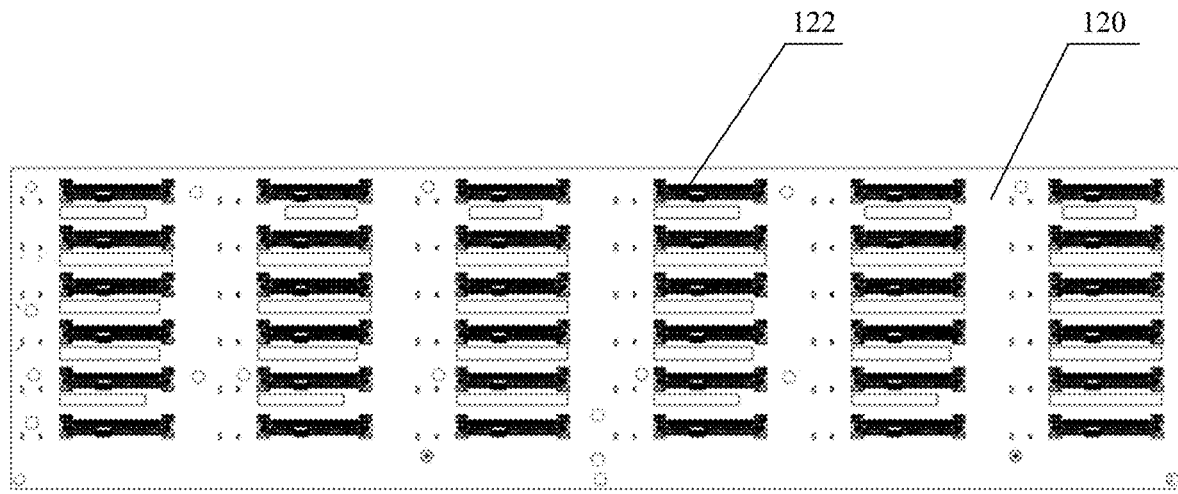
FIG. 8 is a schematic diagram of the structure of the back side of a second backplane in a dual-backplane structure of the present disclosure.
Figure 9:
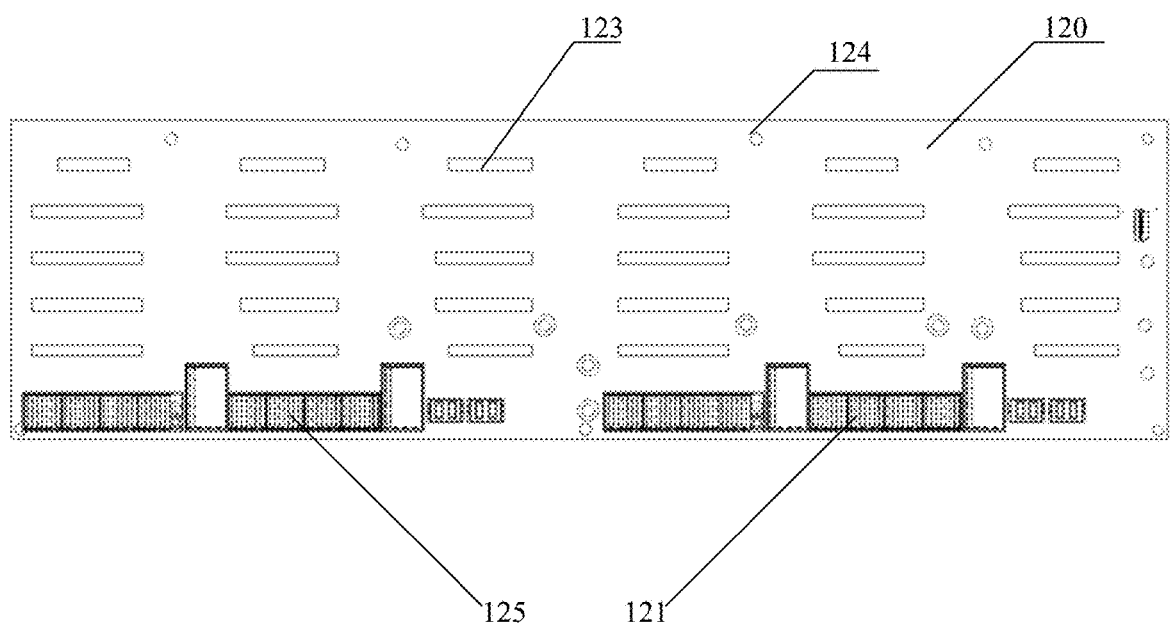
FIG. 9 is a schematic diagram of the structure of the front side of a second backplane in a dual-backplane structure of the present disclosure.
Figure 10:
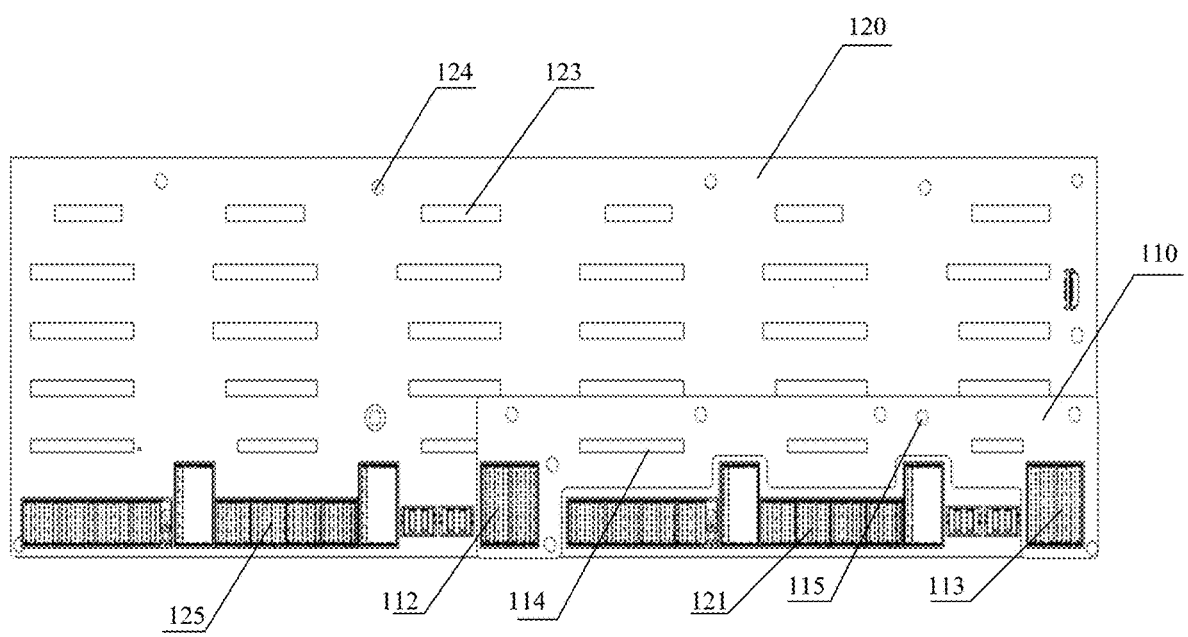
FIG. 10 is a front view of a double backplane structure of the present disclosure.

In this embodiment, as shown in FIG. 5, the second backplane 120 is disposed on a back side of the first backplane 110. As shown in FIGS. 8 and 9, a front side of the second backplane 120 includes at least one connector (e.g., connector 212 and connector 222) connected with a corresponding connector (e.g., connector 121, connector 125) of the first assembly surfaces 213 on the main board of the control module, and the back side of the second backplane 120 includes a plurality of hard disk connectors 122 for connecting with a hard disk module 300. As shown in FIG. 10, at least one connector (e.g., connector 121 or connector 125) on the front side of the second backplane 120 is connected with the corresponding connector (connector 211 or connector 221 shown in FIG. 12) of the first assembly surfaces 213 on the main board of the control module through the opening 111 of the first backplane 110.

In other words, the second backplane 120 includes a plurality of connectors (e.g., connector 121, connector 125) on the front side of the second backplane 120, and some of the connectors (e.g., connector 121) are connected with the corresponding connector (connector 211 or connector 221 shown in FIG. 12) of the first assembly surfaces 213 on the main board of the control module through the opening 111 of the first backplane 110.

In this embodiment, the control module includes the first assembly surface 213 and the second assembly surface 214. That is, in this embodiment, as shown in FIG. 11, the connecting surfaces of the connectors connected with the backplane in the control modules connected by the dual-backplane structure 100 are not all on the same plane. Some of the connectors (connector 211, connector 221) are inwardly retracted by a certain distance, so that they are misaligned with other connectors (connector 212, connector 222), so that the connectors connected with the backplane in the control module form two assembly surfaces: the first assembly surface 213 and the second assembly surface 214. The connectors (connector 212 and connector 222) that are not retracted form the first assembly surface 213, and the connectors (connector 211 and the connector 221) that are retracted form the second assembly surface 214.

The first backplane 110 is used to connect the retracted connectors (connector 211, connector 221) on the main board of the control module. The second backplane 120 is used to connect the non-retracted connectors (connector 212, connector 222) on the main board of the control module.

The retracted connectors (connector 211, connector 221) are installed on the main board of the control module. They are only slightly retracted, therefore the first backplane 110 and the second backplane 120 will not increase the length of the chassis. Therefore, the structure in the present application can match the standard server racks well and has wider applicability. However, it should be noted that the retracted connectors (connector 211, connector 221) should not be retracted too far, and the first backplane 110 and the second backplane 120 should be as close as possible while still reserving room for convenient fixation, so as to reduce wind loss.

The first backplane 110 has a C-shaped structure, which forms a large opening 111. The non-retracted connectors (connector 212, connector 222) on the main board of the control module extend through this opening and directly connect with the connectors (connector 121 or connector 125) of the second backplane 120. In this embodiment, as shown in FIGS. 6 and 7, the upper edge shape of the opening 111 of the first backplane 110 matches the shape of the upper surface of the connector (the connector 212 or the connector 222) on the main board of the control module, with the latter extends through the opening 111.

That is, the lower edge of the first backplane 110 (i.e., the upper edge of the opening 111) depends on the overall shape of the connector (connector 212) of the first assembly surface 213 in the main board of the control module which extends through the opening 111. The height of the opening 111 depends on and is higher than the combined height of the connector 121 of the second backplane 120 and the connector 122 of the first assembly surface 213 in the main board, with the latter extends through the opening 111 and connected with the connector 121.

Figure 12:
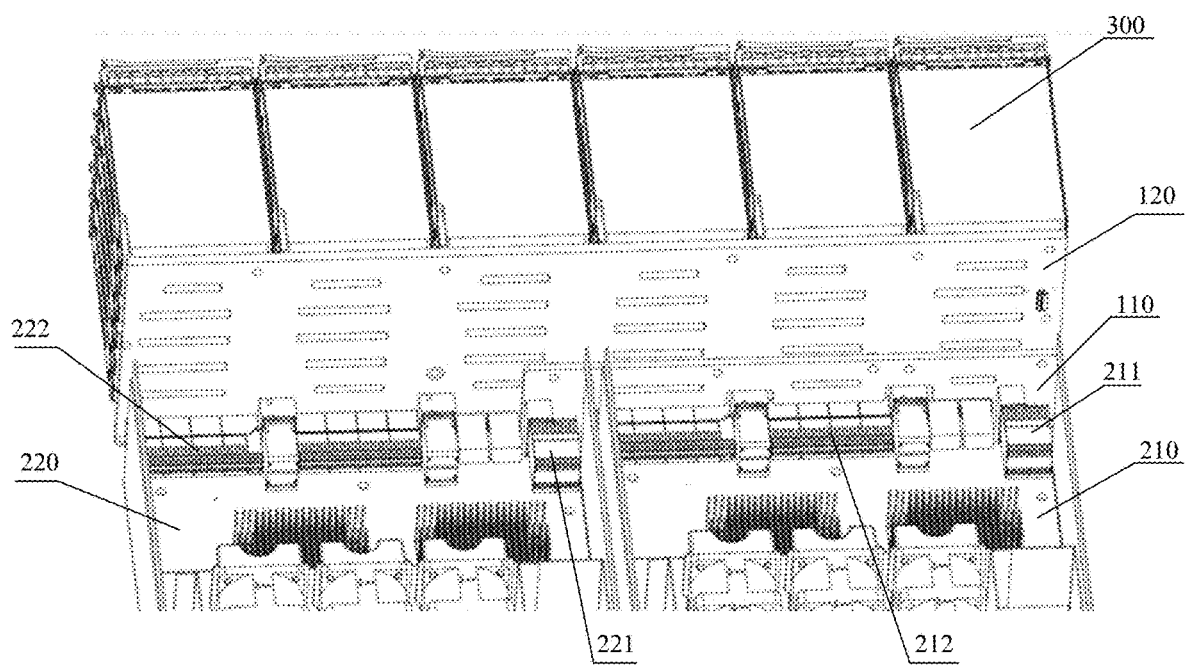
FIG. 12 is a schematic diagram of connections between two control modules and two-backplanes in an electronic device of the present disclosure.

In this embodiment, as shown in FIG. 12, the control module includes a first control module 210 and a second control module 220. The connectors connected by the first backplane 110 include a first connector 112 and a second connector 113. The first connector 112 is connected with the connector 211 in the first control module 210, and the connector 211 is for connecting with the second control module 220. The second connector 113 is connected with the connector 221 in the second control module 220, and the connector 221 is for connecting with the first control module 210.

That is, the first backplane 110 only interconnects signal lines between the two control modules. The remaining signal lines are interconnected through the second backplane 120. The task of interconnecting signal lines is split between different backplanes so that the number of signal lines that a single backplane needs to carry is reduced. The number of PCB layers of backplanes needed is effectively reduced, thereby reducing the cost relating to circuit boards, reducing the fan-out density of signal lines near the connectors on the backplane, and simplifying signal routing on the circuit board.

As shown in FIG. 12, the first control module 210 and the second control module 220 have the same structure. The connector 211 in the first control module 210 for connecting with the second control module 220 and the connector 221 in the second control module 220 for connecting with the first control module 210 are respectively disposed on a side wall of a corresponding control module. The connector 211 in the first control module 210 for connecting with the second control module 220 and the connector 221 in the second control module 220 for connecting with the first control module 210 are respectively inwardly retracted in the main board to form the second assembly surface 214.

In this embodiment, the first connector 112 and the second connector 113 in the first backplane 110 are respectively disposed at two ends of the first backplane 110. The length of the opening 111 matches the length of the connector (connector 212 or connector 222) in the first control module 210 or the second control module 220 that is connected with the connector (connector 121 or connector 125) of the second backplane 120.

If the connector 211 in the first control module 210 for connecting with the second control module 220 and the connector 221 in the second control module 220 for connecting with the first control module 210 are respectively disposed on the side close to the first control module 210, the first backplane 110 is disposed at the first control module 210, as shown in FIG. 12, so that the connector 212 of the first control module 210 is connected with the connector 121 of the second backplane 120 through the opening 111 of the first backplane 110. If the connector 211 in the first control module 210 for connecting with the second control module 220 and the connector 221 in the second control module 220 for connecting with the first control module 210 are respectively disposed on the side close to the second control module 220, the first backplane 110 is disposed at the second control module 220, so that the connector 222 of the second control module 220 is connected with the connector 125 of the second backplane 120 through the opening 111 of the first backplane 110.

As shown in FIGS. 10 and 12, in this embodiment, the length of the first backplane 110 matches the sum of the length of the inwardly retracted connector 211 in the first control module 210, the length of the inwardly retracted connector 221 in the second control module 220, and the distance between the two inwardly retracted connectors. The length of the second backplane 120 matches the width of the first control module 210 combined with the width of the second control module 220.

In this embodiment, the first backplane 110 includes a plurality of ventilation holes 114, and the second backplane 120 includes a plurality of ventilation holes 123. The ventilation holes 114 and the ventilation holes 123 are arranged in an array respectively, and the shapes of the ventilation holes 114 and the ventilation holes 123 may be square, rhombus, etc. Preferably, in the overlapping area of the first backplane 110 and the second backplane 120, the positions and the size(s) of the ventilation holes 114 on the first backplane 110 matches those of the ventilation holes 123 on the second backplane 120, so as to reduce the influence of the first backplane 110 on the wind flow.

In this embodiment, the first backplane 110 includes a plurality of connection holes 115, and the second backplane 120 includes a plurality of connection holes 124. The first backplane 110 and the second backplane 120 are fixed by a plurality of screws or bolts. There is no signal line interconnection between the first backplane 110 and the second backplane 120.

Embodiment 2

This embodiment provides an electronic device. As shown in FIG. 12, the electronic device includes a first control module 210, a second control module 220, a dual-backplane structure 100 connected with the first control module 210 and the second control module 220 as described in Embodiment 1, and a hard disk module 300 connected with a second backplane 120 in the dual-backplane structure 100.

In this embodiment, as shown in FIGS. 11 and 12, the connector 211 in the first control module 210 for connecting with the second control module 220 is retracted inward by a preset distance relative to the main board of the first control module 210; the connector 221 in the second control module 220 for connecting with the first control module 210 is retracted inward by a preset distance relative to the main board of the second control module 220. A vertical outer surface of the inwardly retracted connector 211 in the first control module 210, together with a vertical outer surface of the inwardly retracted connector 221 in the second control module 220, forms the second assembly surface 214. A vertical outer surface of the connector 212, which is not inwardly retracted in the first control module 210, together with a vertical outer surface of the connector 222, which is not inwardly retracted in the second control module 220, forms the first assembly surface 213.

In this embodiment, the length of the second backplane 120 in the dual-backplane structure 100 matches the sum of the width of the first control module 210 and the width of the second control module 220. The length of the first backplane 110 matches the sum of the length of the inwardly retracted connector 211 in the first control module 210, the length of the inwardly retracted connector 221 in the second control module 220, and the distance between the two inwardly retracted connectors 211 and 221.

In this embodiment, the electronic device is a server, a storage, or an industrial computer, etc. The electronic device is server or storage or industrial computer with a dual control module and a height of 2U or more than 2U.

Embodiment 1 has described the dual-backplane structure 100 in detail, which will not be repeated here.

In addition, in order to highlight the innovative part of the present disclosure, technical features that are not closely related to solving the technical problems pointed out by the present disclosure are not introduced in this embodiment, but this does not indicate that there are no alternative structures or functional features of this embodiment.

It should be noted that the diagrams provided in this embodiment only illustrate the basic idea of the present disclosure in a schematic manner. They only show the components related to the present disclosure, and do not limit the number, shape, and size of each component in actual implementation. The type, quantity, and proportion of each component can be changed during actual implementation, and the components' layout may also be more complicated.

In summary, in the dual-backplane structure of the present disclosure, the task of interconnecting signal lines is split between different backplanes so that the number of signal lines that a single backplane needs to carry is reduced. The number of interconnected signal lines between the control modules can be increased without increasing the width and length of the chassis, and the fan-out density of the backplane signal lines near the connectors can be effectively reduced, thereby simplifying circuit board wiring and reducing the number of circuit board layers needed. Therefore, the cost relating to circuit boards is reduced, which makes the dual-backplane structure of the present disclosure in the present application especially suitable for side by side servers, storages and other electronic devices with dual control modules. In the dual-backplane structure of the present disclosure, the main board and its connectors are only slightly retracted, and the length of the chassis will not be increased, therefore the structure can match the standard server racks and has wider applicability. Therefore, the present disclosure effectively overcomes various shortcomings in the prior art and has high industrial value.

The above-mentioned embodiments only exemplary illustrate the principles and effects of the present disclosure, and are not used to limit the present disclosure. Anyone familiar with this technology can modify or change the above-mentioned embodiments without departing from the spirit and scope of the present disclosure. Therefore, all equivalent modifications or changes made by those with ordinary knowledge in the technical field without departing from the spirit and technical ideas disclosed in the present disclosure should still be covered by the claims of the present disclosure.

What is claimed is:

1. A dual-backplane structure, comprising:
   a first backplane, having an opening, wherein a front side of the first backplane includes at least one connector connected with a connector of the second assembly surface on the main board of a control module; and
   a second backplane disposed on a back side of the first backplane,
   wherein a front side of the second backplane includes at least one connector,
   which is connected with a connector of the first assembly surface on the main board of the control module through the opening of the first backplane,
   wherein a back side of the second backplane includes a plurality of hard disk connectors for connecting with a hard disk module, at least one connector on the front side of the second backplane is connected with the connector corresponding to the first assembly surface on the main board through the opening of the first backplane.

2. The dual-backplane structure according to claim 1, wherein an upper edge of the opening of the first backplane has a shape matching an upper surface of the connector on the main board of the control module that extends through the opening.

3. The dual-backplane structure according to claim 1, wherein the control module includes a first control module and a second control module, the connector of the first backplane includes a first connector and a second connector, which are respectively connected with a connector in the first control module for connecting with the second control module and a connector in the second control module for connecting the first control module.

4. The dual-backplane structure according to claim 3, wherein the first connector and the second connector in the first backplane are respectively disposed at two ends of the first backplane, the length of the opening matches the length of either a connector in the first control module that is connected with the at least one connector of the second backplane, or a connector in the second control module that is connected with the at least one connector of the second backplane.

5. The dual-backplane structure according to claim 1, wherein the first backplane and the second backplane respectively includes a plurality of ventilation holes.

6. The dual-backplane structure according to claim 5, wherein in an overlapping area of the first backplane and the second backplane, the ventilation holes in the first backplane match the ventilation holes in the second backplane in terms of size and position.

7. The dual-backplane structure according to claim 1, wherein the first backplane and the second backplane are fixed by a plurality of screws or bolts.

8. An electronic device, comprising:
   a first control module and a second control module placed side by side;
   a dual-backplane structure connected with the first control module and the second control module in claim 1, and
   a hard disk module connected with a second backplane in the dual backplane structure.

9. The electronic device according to claim 8, wherein a connector in the first control module for connecting with the second control module is retracted inward by a preset distance relative to the main board of the first control module, a connector in the second control module for connecting with the first control module is retracted inward by a preset distance relative to the main board of the second control module; an outer surface of the inwardly retracted connector in the first control module together with an outer surface of the inwardly retracted connector in the second control module forms the second assembly surface; an outer surface of a connector which is not inwardly retracted in the first control module together with an outer surface of a connector which is not inwardly retracted in the second control module forms the first assembly surface.

10. The electronic device according to claim 8, wherein a length of the second backplane in the dual-backplane structure matches the sum of a width of the first control module and a width of the second control module; a length of the first backplane in the dual-backplane structure matches a sum of a length of the inwardly retracted connector in the first control module, a length of the inwardly retracted connector in the second control module, and a distance between the two inwardly retracted connectors.

* * * * *